United States Patent
Kallio et al.

(10) Patent No.: US 6,522,205 B2
(45) Date of Patent: Feb. 18, 2003

(54) LONG TERM STABILITY OF AN OSCILLATOR USING A TIME SOURCE ON A PACKET SWITCHED NETWORK

(75) Inventors: Janne Kallio, Ylöjärvi (FI); Ari Helaakoski, Pattijoki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/810,017

(22) Filed: Mar. 16, 2001

(65) Prior Publication Data

US 2001/0022536 A1 Sep. 20, 2001

(30) Foreign Application Priority Data

Mar. 17, 2000 (FI) ............................................. 20000638

(51) Int. Cl.[7] .............................. H03L 7/00; H03L 7/08; H03L 7/085; G01R 23/00
(52) U.S. Cl. ......................... 331/1 R; 331/14; 331/17; 331/18; 331/25; 331/44
(58) Field of Search ................................ 331/1 A, 1 R, 331/14, 17, 18, 25, 44

(56) References Cited

U.S. PATENT DOCUMENTS

| | | | |
|---|---|---|---|
| 4,591,730 A | | 5/1986 | Pennoni ........................ 370/104 |
| 4,759,041 A | | 7/1988 | Anderson et al. ............. 375/118 |
| 4,868,522 A | * | 9/1989 | Popat et al. ..................... 331/2 |
| 5,473,284 A | | 12/1995 | Jantti et al. ..................... 331/10 |
| 5,565,923 A | * | 10/1996 | Zdepski ........................ 348/423 |
| 5,918,041 A | * | 6/1999 | Berstis ......................... 395/558 |
| 6,023,769 A | * | 2/2000 | Gonzalez ..................... 713/400 |
| 6,323,713 B1 | * | 11/2001 | Yuzue .......................... 327/291 |

FOREIGN PATENT DOCUMENTS

| | | |
|---|---|---|
| EP | 0459039 A1 | 12/1991 |
| EP | 0777342 A3 | 6/1997 |
| WO | WO 94/21047 | 9/1994 |
| WO | WO 99/48311 | 9/1999 |
| WO | WO 99/60755 | 11/1999 |

* cited by examiner

*Primary Examiner*—David C. Mis
(74) *Attorney, Agent, or Firm*—Perman & Green, LLP

(57) ABSTRACT

The invention relates to a method for adjusting an oscillator (44), a packet switched network (21) locating between the oscillator and a specified time source (31), which knows a clock time with a specified accuracy. In the method, a clock (42), which is on the same side of the packet switched network (21) as the adjustable oscillator (44), is updated over the packet switched network (21) on the basis of the clock time known to said time source (31). Said clock (42) is used in the adjustment of the oscillator (44) for making the oscillator (44) to oscillate at a desired frequency. The invention also relates to an apparatus and computer software for adjusting the oscillator. (FIG. 4)

17 Claims, 6 Drawing Sheets

LONG TERM STABILITY OF AN OSCILLATOR USING A TIME SOURCE ON A PACKET SWITCHED NETWORK

FIELD OF THE INVENTION

The present invention relates to adjustment of an oscillator. Particularly, but not necessarily, the invention relates to the adjustment of an oven stabilized crystal oscillator in a base station system over a packet switched network for improving the long-term stability of the oven stabilized crystal oscillator.

BACKGROUND OF THE INVENTION

The base station system in a digital cellular radio system, such as a GSM (Global System for Mobile Communications) network, typically comprises one or more base stations and a base station controller which controls said base stations. Timing and clock signals used in the base station and the base station transmission frequency are typically derived from a locally generated master clock signal whose stability requirement in the GSM system, for instance, is 0.05 ppm. One option to try to meet this stability requirement is to use as the master oscillator of the base station a crystal oscillator positioned in a space having a stable ambient temperature, a so-called oven. A crystal oscillator of this kind is commonly known as an oven stabilized crystal oscillator.

The frequency generated by the oven stabilized crystal oscillator is very accurate in the short term, but due to aging of the oscillator, instability appears in the frequency generated by the oscillator in the long term. When the oscillating frequency changes, the transmission frequency of the base station to be derived from the oscillation of the oscillator changes as well. When the change in frequency grows excessively as compared with the nominal frequency, the transmission frequencies of the base station start interfering with other GSM traffic. A means for improving long-term stability of the oscillator is therefore required.

FIG. 1 illustrates the prior art GSM system. Base stations BTS and a base station controller BSC controlling said base stations constitute a base station system BSS. An interface between a mobile services switching centre MSC and the base station controller BSC is called A-interface and an interface between the base station controller BSC and the base stations BTS is called Abis-interface. FIG. 1 also shows a wireless terminal equipment MS communicating with the base station BTS. Standard, digital PCM (Pulse Code Modulation) connections, e.g. 2.048 Mbit/s, are used in communication between the mobile services switching centre MSC, the base station controller BSC and the base stations BTS. U.S. Pat. No. 5,473,284 discloses a solution in which an adjustable oven stabilized crystal oscillator is used for improving long-term stability of the oven stabilized crystal oscillator of the base station, a reference frequency (e.g. 2.048 MHz) used for the adjustment being derived from the PCM connection between the base station controller and the base station.

Said reference frequency derived from the PCM connection and used for the adjustment of the oven stabilized crystal oscillator can be considered very accurate, since typically the clock signal of the PCM connection is originally synchronized with a signal originating from an atomic clock in the mobile service switching centre MSC.

However, if a PCM clock signal is not available to the base station system, for some reason or other, the solution disclosed in U.S. Pat. No. 5,473,284 is not useful. For instance, this is the case when there is a packet switched network, such as an IP (Internet Protocol) network or an X.25 network, between the mobile services switching centre MSC and the base station system BSS.

SUMMARY OF THE INVENTION

A new solution is now found to adjust the oscillator over the packet switched network. A first aspect of the invention implements a method for adjusting the oscillator in a system, the system comprising an adjustable oscillator, a time source knowing a clock time with a specified accuracy, and a packet switched network between the oscillator and said time source.

The method is characterized by
updating a clock on the basis of the time known to said time source over the packet switched network, the clock being on the same side of the packet switched network as the adjustable oscillator;
using said clock in the adjustment of the oscillator for adjusting the oscillator to oscillate at a desired frequency.

A second aspect of the invention implements an apparatus for adjusting the oscillator in a system, the system comprising an adjustable oscillator, a time source knowing a clock time with a specified accuracy, and a packet switched network between the oscillator and said time source.

The apparatus is characterized by comprising
a clock which is on the same side of the packet switched network as the adjustable oscillator;
updating means for updating the clock over the packet switched network on the basis of the time known to said time source;
control means for adjusting the oscillator to oscillate at a desired frequency by means of said clock.

A third aspect of the invention implements computer software for adjusting the oscillator in a system, the system comprising an adjustable oscillator, a time source knowing a clock time with a specified accuracy, and a packet switched network between the oscillator and said time source.

The computer software is characterized by comprising a program code for
updating the clock over the packet switched network on the basis of the clock time known to said time source, the clock being on the same side of the packet switched network as the adjustable oscillator;
using said clock in the adjustment of the oscillator for making the oscillator to oscillate at a desired frequency.

The term digital convergence refers to integrating voice and data communications in a telecommunications network. Typically, it is assumed that the telecommunication network is a packet switched network based on the IP protocol, whereby e.g. transmission of voice communication over said packet switched network is called Voice over IP (VoIP). Network architecture, in which for instance voice and data communications of a company are integrated in the same packet switched network, is called WIO (Wireless Intranet Office). Even though the WIO system and the IP network are used below as examples in a preferred embodiment of the invention, it is also possible to apply the invention to other systems, and the invention can be implemented in essence also in connection with other than IP-based packet switched networks, such as X.25 packet switched network.

BRIEF DESCRIPTION OF THE DRAWINGS

In the following, the invention will be described in greater detail with reference to the attached drawings, in which.

DETAILED DESCRIPTION

Figure 1:
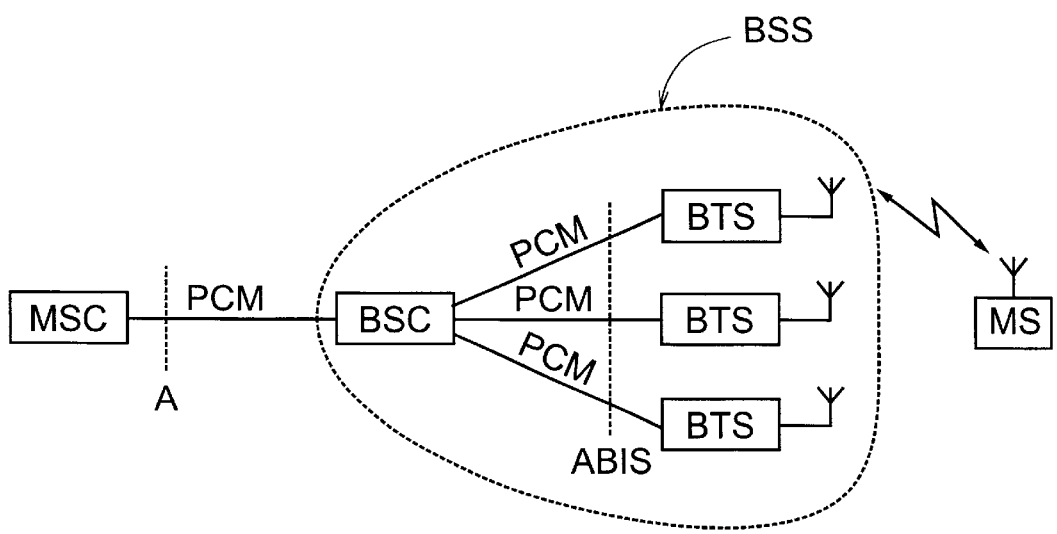
FIG. 1 shows a prior art GSM system.
Figure 2:
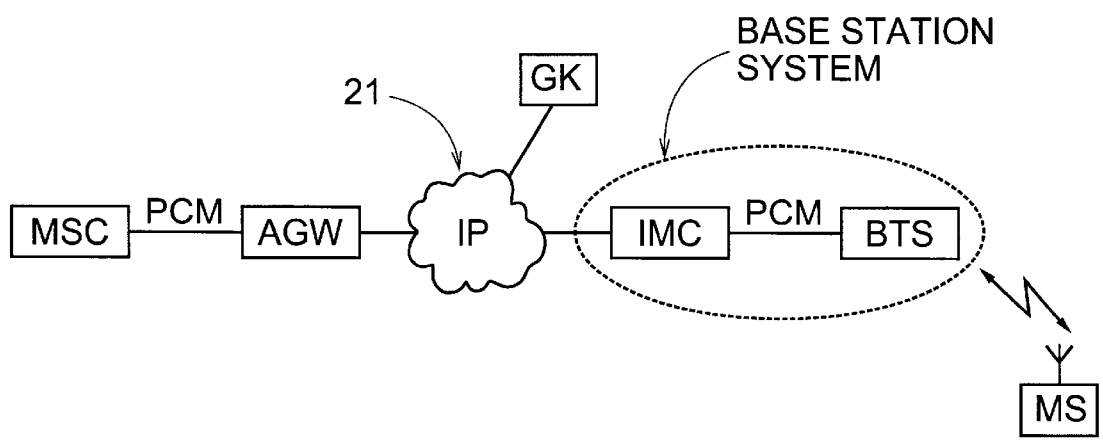
FIG. 2 illustrates network elements in WIO system.

FIG. 1. is described above in connection with the description of the prior art. A preferred embodiment of the invention will be set forth next in connection with the WIO system. In some connections, said system is also referred to as GIO (GSM Intranet Office). FIG. 2 illustrates network elements of the WIO system in a simplified manner. A mobile services switching centre MSC communicates with an IP network 21 via A-interface Gateway AGW. Said IP network 21 can be the Internet network or an Intranet network (LAN, Local Area Network) of a company. Between the IP network 21 and the base station BTS there is an IMC (Intranet Mobile Cluster) gateway whose task, among other things, is to control a base station BTS and to convey traffic between the IP network 21 and the base station BTS to a wireless terminal equipment MS. In general, IMC and BTS are apart from each other but integration of IMC and BTS is also possible. In connection with the WIO system, the term base station system refers in the present specification to the whole formed by IMC and BTS. Naturally, a plurality of base stations BTS can be subordinated to one IMC. One of the most important tasks of the gatekeeper GK communicating with the IP network 21 is to provide call control functions. The WIO system has a PCM connection between MSC and AGW as well as between IMC and BTS. Then, MSC cannot provide a PCM clock signal to be used in the adjustment of an oven stabilized crystal-oscillator in the base station system, since a packet switched network 21, over which the PCM signal does not propagate, exists between AGW and IMC. The oven stabilized crystal oscillator is physically located either in IMC or in BTS. The WIO system and the elements thereof are described in greater detail in WO 99/48311.

Figure 3:
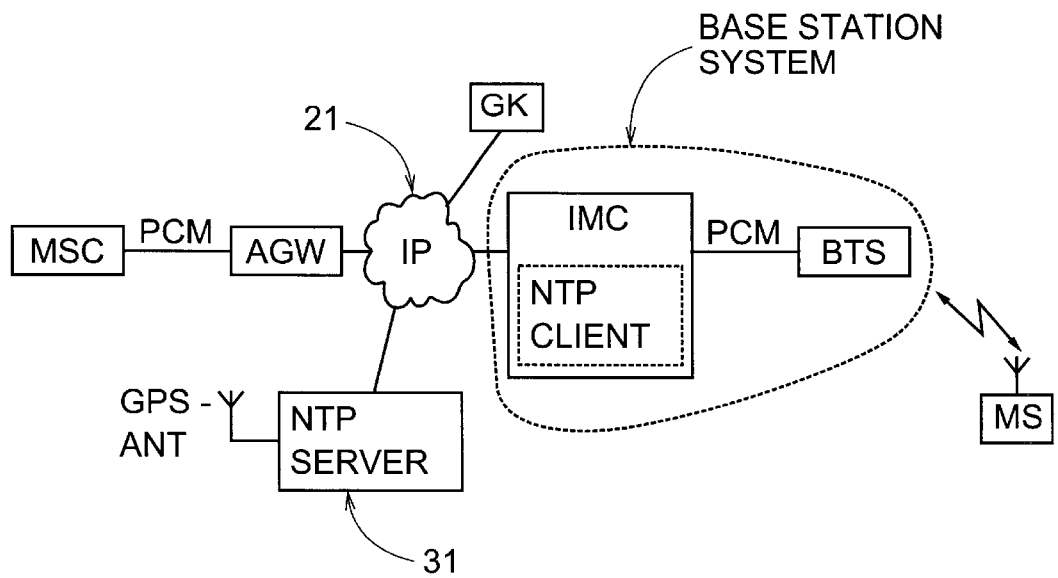
FIG. 3 shows an arrangement according to the invention.

FIG. 3 shows an arrangement according to the invention, which enables the adjustment of the oven stabilized crystal oscillator in order to improve its longterm stability. As compared with FIG. 2, an NTP (Network Timing Protocol) server 31 which communicates with the IP network 21 and which knows an extremely precise clock time, is introduced as a new element in FIG. 3. The NTP server 31 operates in accordance with the NTP protocol and its maximum clock time error as compared with the absolutely precise clock time is, in a normal situation, typically a few nano- or picoseconds a day. The time of the NTP server 31 (NTP time) originates from a precise crystal or the GPS system (Global Positioning System), for instance. In the latter case, the NTP server 31 can receive the time from the GPS system by means of its GPS antenna (GPS-ANT), for instance. The NTP protocol and the GPS system are known as such to the person skilled in the art.

FIG. 3 also illustrates the location of the NTP client. The NTP client is located in the base station system. Preferably the client is located in IMC. Alternatively, the client can be located in BTS. In physical terms, the NTP client is preferably an additional card to be installed in a personal computer PC. The card has an operating system supporting the NTP protocol, such as Linux operating system. Alternatively, IMC and the NTP client can also be one embedded system.

Figure 4:
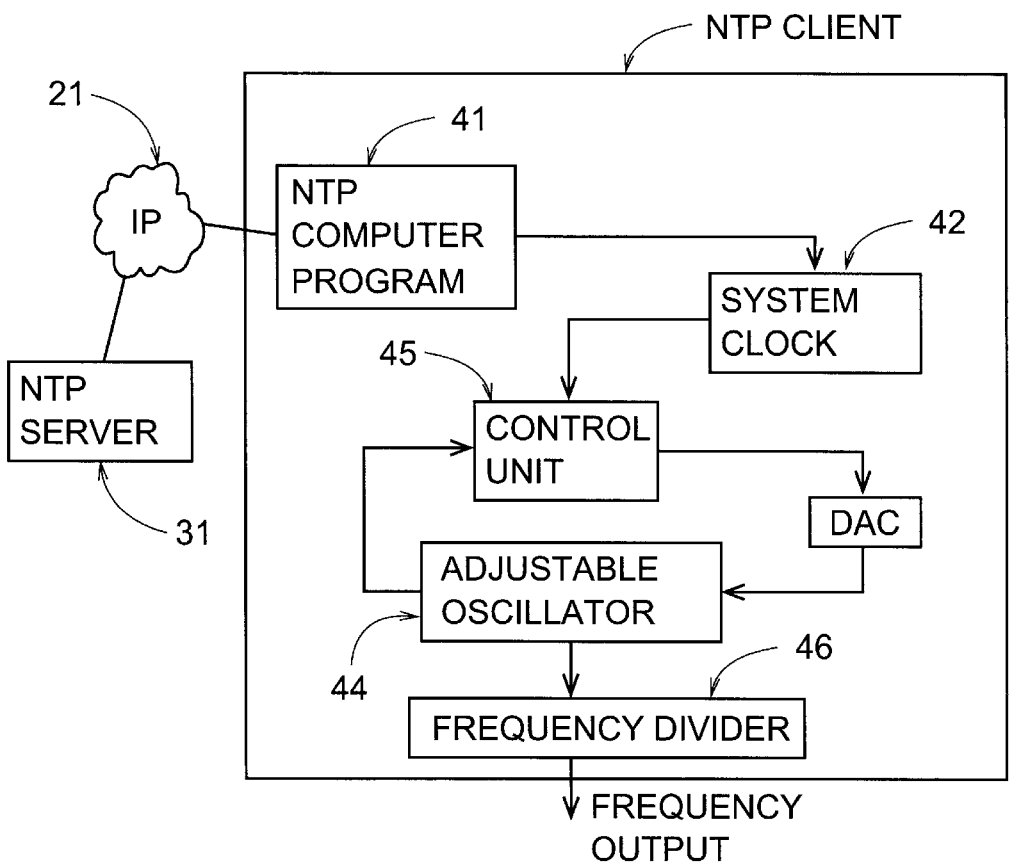
FIG. 4 illustrates an NTP client according to the invention in a preferred embodiment of the invention.

The structure and functions of the NTP client are described in greater detail in FIG. 4. The NTP client comprises an NTP computer program 41 (e.g. NTP server program) and a system clock 42 whose time the NTP computer program controls by means of software. A reference signal of the system clock 42 is obtained from the PC's real time clock (not shown in the figure). The reference signal of the real time clock, in turn, is typically obtained from a separate crystal oscillator (not shown in the figure) of the PC. The real time clock can also be called a hardware clock, and it ticks even when power is switched off in the rest of the apparatus. The system clock 42 can also be called a software clock, and it ticks only when power is switched on in the apparatus and the operating system is booted. The system clock 42 is initialized on the basis of the real time clock in connection with boot, and its running is based on the reference signal obtained from the real time clock. In practice, said reference signal is implemented by so-called interrupts or ticks, in which the real time clock interrupts the system clock 42 at a determined frequency. The frequency can be e.g. 100 Hz, whereby an interrupt occurs hundred times a second.

In the NTP adjustment of the system clock 42, the NTP computer program 41 inquires in accordance with the NTP protocol, for instance at one minute intervals, an NTP time from the NTP server 31 over the IP network 21. Having received the clock time from the NTP server 31, the NTP computer program 41 compares the time of the system clock 42 with the received NTP time and, depending on the difference between the clock times, updates the system clock 42, i.e. corrects the rate of the system clock 42 by means of software. If the time of the system clock 42 is behind the NTP time, the NTP computer program 41 adjusts the rate of the system clock faster. But if the time of the system clock 42 is ahead of the NTP time, the NTP computer program adjusts the rate of the system clock slower. The adjustment typically takes a few seconds. In practice, the rate adjustment of the system clock 42 performed by the NTP computer program 41 can be implemented by a tickadj system command, for instance. If the system clock 42 time and the received NTP time differ greatly, the NTP computer program 41 can update the time of the system clock 42 also directly, i.e. to shift the system clock time to correspond the received NTP time.

The PC oscillator, from which the reference signal is obtained for the real time clock and further to the system clock 42, generally oscillates all the time either at an excessively high frequency or at an excessively low frequency. The system clock time is then most accurate immediately after the NTP adjustment. As time elapses after the NTP adjustment, the system clock tends to be fast or slow, depending on the PC oscillator frequency. The system clock will be readjusted to the correct time in connection with a subsequent NTP adjustment. The NTP computer program stores the difference between the system clock 42 time and each NTP time received from the NTP server 31, which difference is used in the NTP adjustment of the system clock 42, in a log file in the system memory as a so-called offset value. Offset values are also utilized in the method according to the invention in a manner that will be described later in this specification.

The oscillator 44 whose long-term stability will be improved by the arrangement according to the invention is preferably a voltage-controlled oven stabilized crystal oscillator whose short-term stability is sufficient for the system to operate reliably. The oscillator is preferably located in the NTP client or at least having an electric connection thereto, however, in such a way that at least no packet switched network exists between the oscillator 44 and the NTP client. The oscillator 44 generates a signal that typically oscillates between given voltage levels. This is commonly known as oscillation. The output voltage of a digital-to-analog converter DAC controls the oscillating frequency of the oscillator 44, the output voltage being formed by DAC on the basis of a digital control value, DAC control word, supplied by a control unit 45. Typically, the higher the DAC output voltage, the higher the frequency at which the oscillator 44 oscillates. A signal of nominal frequency generated by the oscillator 44 is divided in a frequency dividing circuit 46 by a suitable divisor, whereby a clock signal of the desired frequency (e.g. 2.048 MHz) is provided at the frequency output for the use of the base station system. For example, the transmission frequency of the base station BTS is derived from said clock signal. If the NTP client and the oscillator 44 are located in IMC, the clock signal can be supplied to the base station BTS, for instance, over the PCM connection between IMC and the base station.

In a preferred embodiment of the invention, the adjustment of the oscillator is performed by a control loop which includes a control unit 45, DAC and the oscillator 44. The control unit 45 controls the operation of the control loop. The control unit comprises a processor which can be the processor of the PC or that of the NTP client. In addition to the processor, the control unit comprises a counter (one or more) for counting the oscillation pulses generated by the oscillator 44 and computer software for controlling the adjustment process of the oscillator in its program memory. The counter can be implemented by a counter circuit, for instance. However, the counter is preferably implemented by means of software. The time of the system clock 42 is known to the control unit. The control unit 45 has also access to the log file in the memory where the above-mentioned offset values are stored.

Figure 6:
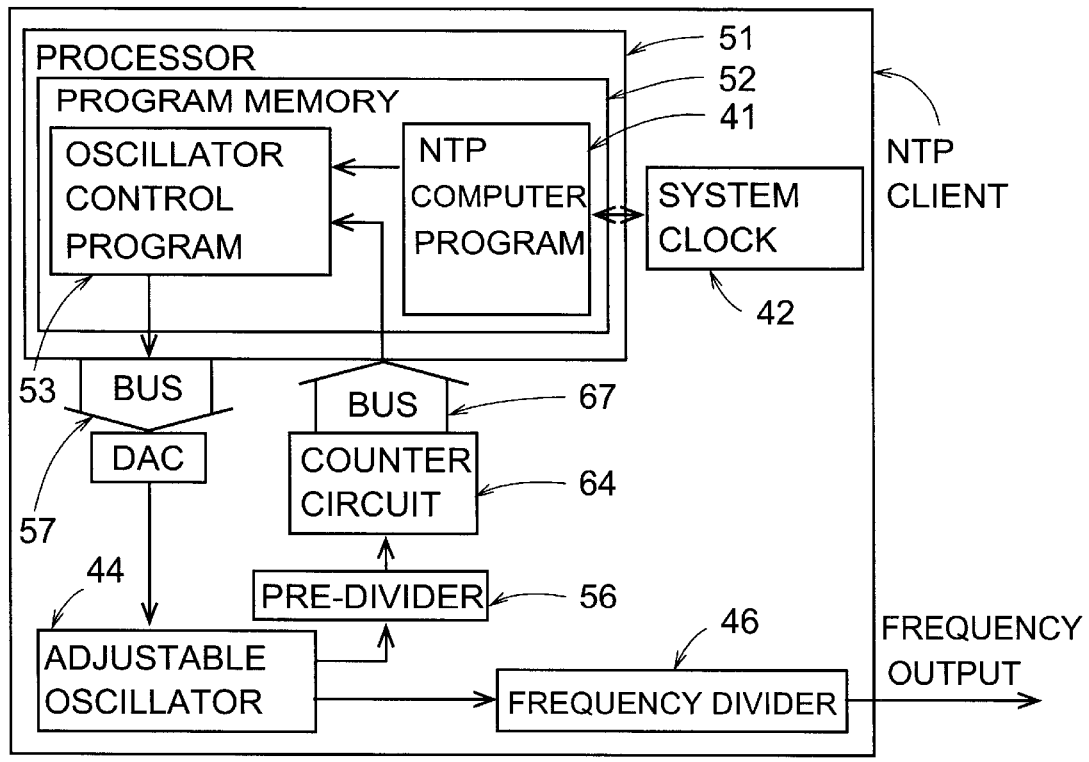
FIG. 6 shows a control loop for adjusting an oscillator in the case where a counter of an NTP client is implemented by means of a counter circuit.
Figure 5:
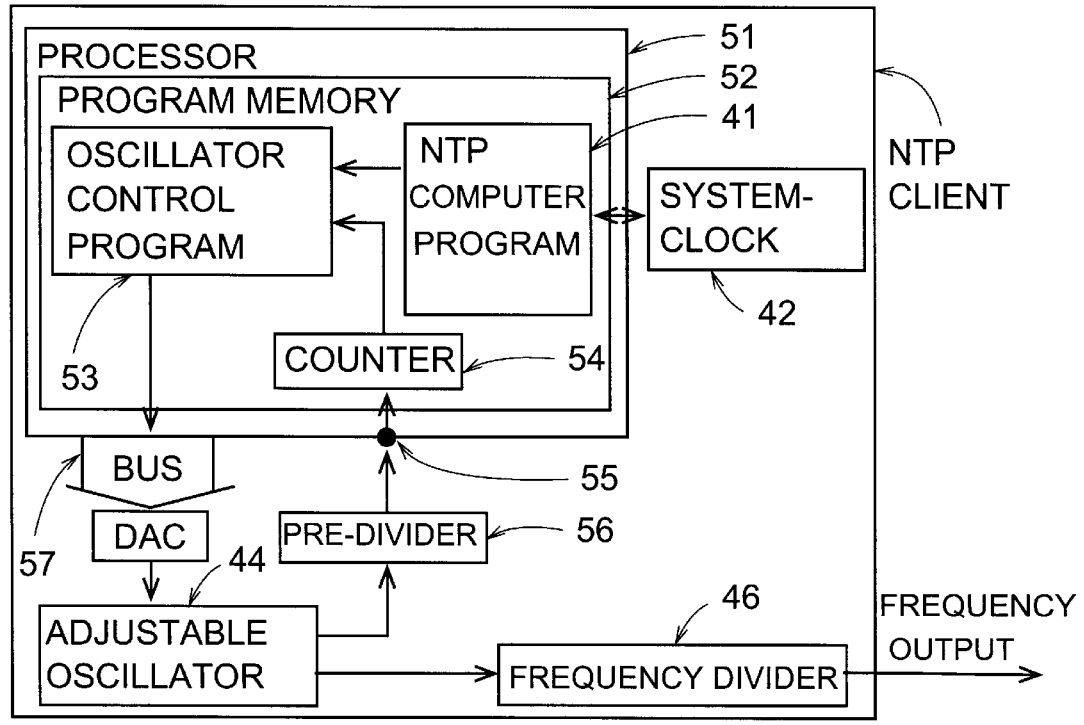
FIG. 5 shows a control loop for adjusting an oscillator in the case where a counter of an NTP client is implemented by means of software.

FIG. 5 illustrates parts of the control unit. 45 and the control loop used for adjusting the oscillator 44 as a whole in still greater detail in the case where the counter used for counting the oscillation pulses is implemented by means of software. Apart from the oscillator 44, DAC, the frequency divider 46 and the system clock 42, FIG. 5 shows the processor 51 of the control unit and the program memory 52 of the control unit. In addition to the NTP computer program 41, a computer program used for controlling the adjustment process of the oscillator, an oscillator control program 53, is stored in the program memory 52. The program memory 52 also comprises a register serving as a pulse counter 54, the value of which the processor 51 increases every time a vibration pulse generated by the oscillator 44 reaches an interrupt pin 55 of the processor. Prior to arriving in the interrupt pin 55 of the processor, oscillation generated by the oscillator 44 is applied through a pre-divider 56. In the predivider the oscillation is divided into a lower frequency for the processor 51 in order that the processor has time to handle the pulses (interrupts) arriving in the interrupt pin 55. A bus 57 is used for supplying the DAC control word from the oscillator control program 53 to the digital-to-analog converter DAC, for instance. FIG. 6 illustrates a control loop used for adjusting the oscillator 44 in the case where the counter used for counting the oscillation pulses is implemented by a counter circuit 64. The counter circuit 64 is an integrated circuit, to which the oscillation pulses of the oscillator 44 are applied via a pre-divider. 56. The oscillator control program 53 employs a bus 67 for controlling the counter circuit and for inquiring the results of pulse counting from the counter. Otherwise, FIG. 6 corresponds the arrangement of FIG. 5.

Figure 7:
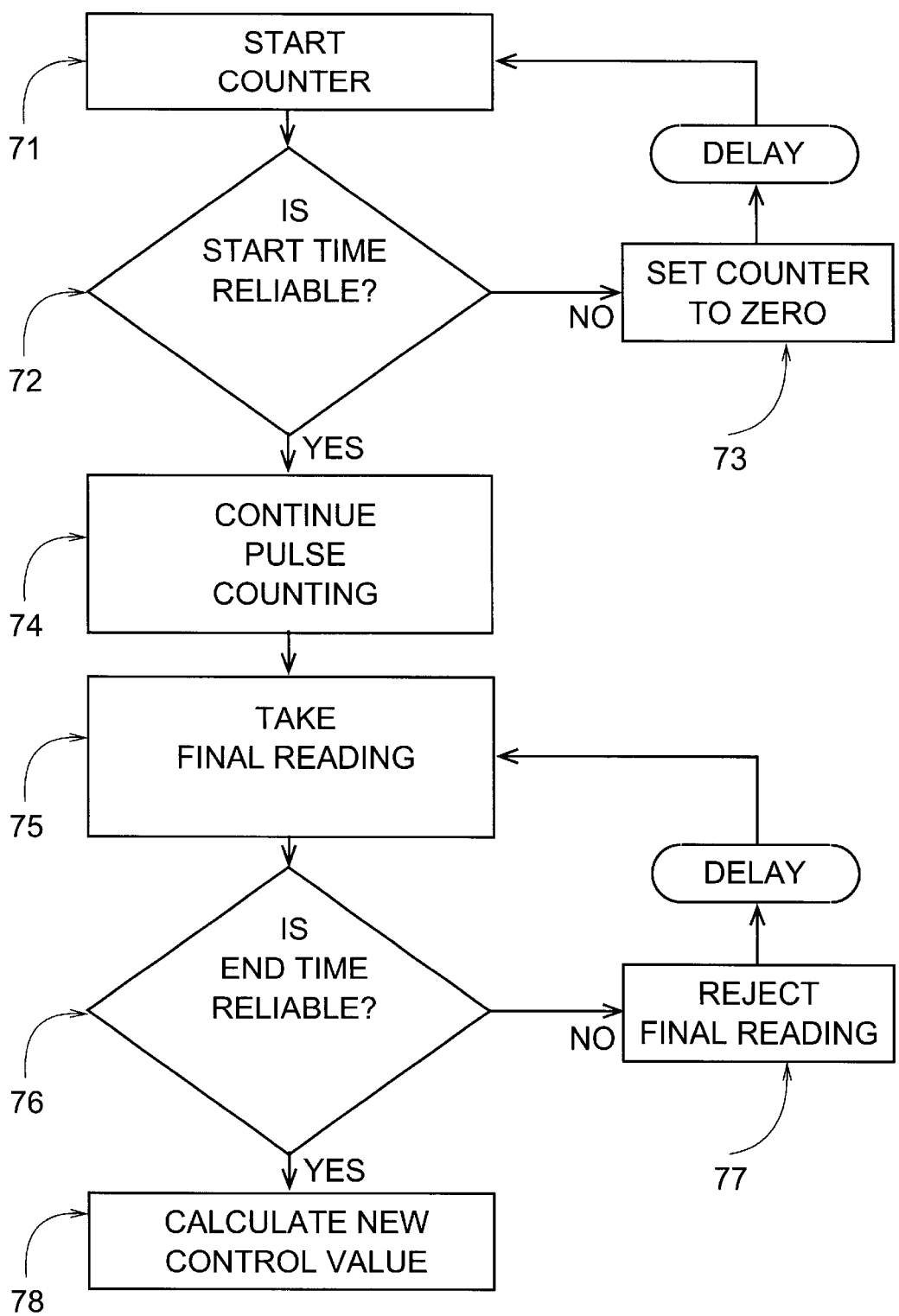
FIG. 7 is a flow chart that illustrates a method for adjusting the oscillator according to the invention.

It is described next, how the above-described apparatus implements the adjustment of the oscillator according to the preferred embodiment of the invention. In the description, reference is made to the flow chart of FIG. 7.

The adjustment of the oscillator 44 comprises two separate periods temporally, the first of which is called a monitoring period and the second is called an actual adjustment period of the oscillator. During the monitoring period, it is found out how well the oscillator 44 oscillates at the nominal frequency. The monitoring period starts and ends with the time of the system clock 42. The monitoring period is preferably started and ended as soon as possible after the NTP adjustment of the system clock, because, in a normal situation, the system clock time is most accurate immediately upon the NTP adjustment. This is how the accuracy of the adjustment of the oscillator 44 can be improved, in particular if the time interval between the NTP adjustments of the system clock 42 is long. The monitoring period is followed by the oscillator adjustment period when the oscillating frequency of the oscillator 44 is adjusted on the basis of the monitoring period results.

One output of the oscillator 44 is applied to a pulse counter 54, 64. The monitoring period is initiated by starting the pulse counter (block 71) at a system clock 42 time instant $t_o$ when the pulse counter starts counting the oscillator pulses generated by the oscillator 44. Thereafter the oscillator control program 53 checks if the start time $t_o$ is reliable (block 72). It is checked here whether the system clock 42 time at the moment of starting the counter 54, 64 can be considered reliable. For instance, if network loading varies considerably when the NTP computer program 41 of the NTP client inquires and receives the NTP time from the NTP server 31, the NTP time on which the NTP adjustment is based may be unreliable. Hence, it is not convenient to use as the start time $t_0$ of the monitoring period the system clock 42 time, which is based on the NTP adjustment immediately preceding said clock time, the offset value, which serves as a basis of said NTP adjustment, being in turn based on said particular unreliable NTP time.

The system clock 42 time can be unreliable as the start time $t_o$, even though the NTP time, on the basis of which the NTP adjustment was performed immediately prior to the start time, were reliable. This kind of disturbance may arise, for instance, if the inquiry sent by the NTP computer program disappears on its way to the NTP server. Then the NTP computer program 41 will not receive the NTP time from the NTP server for the NTP adjustment, and consequently the NTP adjustment is omitted. Let us assume that the NTP adjustment subsequent to the omitted NTP adjustment is performed in due course. However, the offset value, on the basis of which this NTP adjustment is performed, is on average twice the mean offset value, because the time the system clock has passed since the preceding NTP adjustment is twice the usual time. And, since the NTP adjustment is of averaging nature, the NTP computer program 41 does not adjust the system clock 42 time to be exactly correct but it overcorrects the system clock time such that if the system clock time was behind the NTP time when the NTP adjustment started, it will be ahead of the NTP time after the NTP adjustment, and vice versa. It takes still a few NTP adjustments before the disturbance is completely stabilized to the effect that the NTP adjustment always provides a correct time for the system clock. As a consequence, a few system clock 42 times based on NTP adjustments effected immediately after disturbances should not be used as the start time $t_0$ of the monitoring period.

The reliability of the start time $t_0$ is checked in the preferred embodiment of the invention by setting a limit value to the offset and by comparing absolute values of the offsets used in the NTP adjustments preceding the start time $t_0$ with said limit value. The oscillator control program 53 performs said measures. At least the absolute value of the offset value used in the NTP adjustment immediately preceding the start time $t_0$ is compared with the limit value. Preferably however, the absolute values of the offsets used in more than one, preferably six, NTP adjustments immediately preceding the start time $t_0$ are compared with the limit value. If the absolute values of all six offsets are lower than said limit value and if no offset is omitted, nothing indicates disturbance prior to the start time $t_0$ and the start time $t_0$ can be considered reliable. But if even one of the offsets exceeds said limit value or one of the offsets is omitted, the start time $t_0$ is not reliable. The limit value can be one or a few milliseconds.

If the start time $t_0$ is reliable on the basis of the above-described monitoring, the oscillator control program 53 stores the time instant $t_0$ in the system memory as the start time and the oscillator 44 pulse counting is continued with the pulse counter 54, 64 in a conventional manner (block 74).

But if the start time $t_0$ is not reliable, the oscillator control program 53 sets the counter value to zero by means of software with a reset command (block 73). The counter is restarted (transfer to block 71) after a delay $\Delta t$ at a time instant $t_0+\Delta t$ when the effect of the offset that led to rejection of a previous start time $t_0$ has disappeared. Thereafter, the NTP computer program 41 checks again whether the start time ($t_0+\Delta t$) is now reliable (block 72). If it is reliable, the time instant $t_0+\Delta t$ is now stored in the system memory as the start time and oscillator 44 pulse counting is continued with the pulse counter 54, 64 (block 74). If the start time is not yet reliable, block 73 is returned to for setting the counter to zero, whereafter the counter is restarted after a given delay, and so on. Iteration continues until a reliable start time is found.

Figure 8:
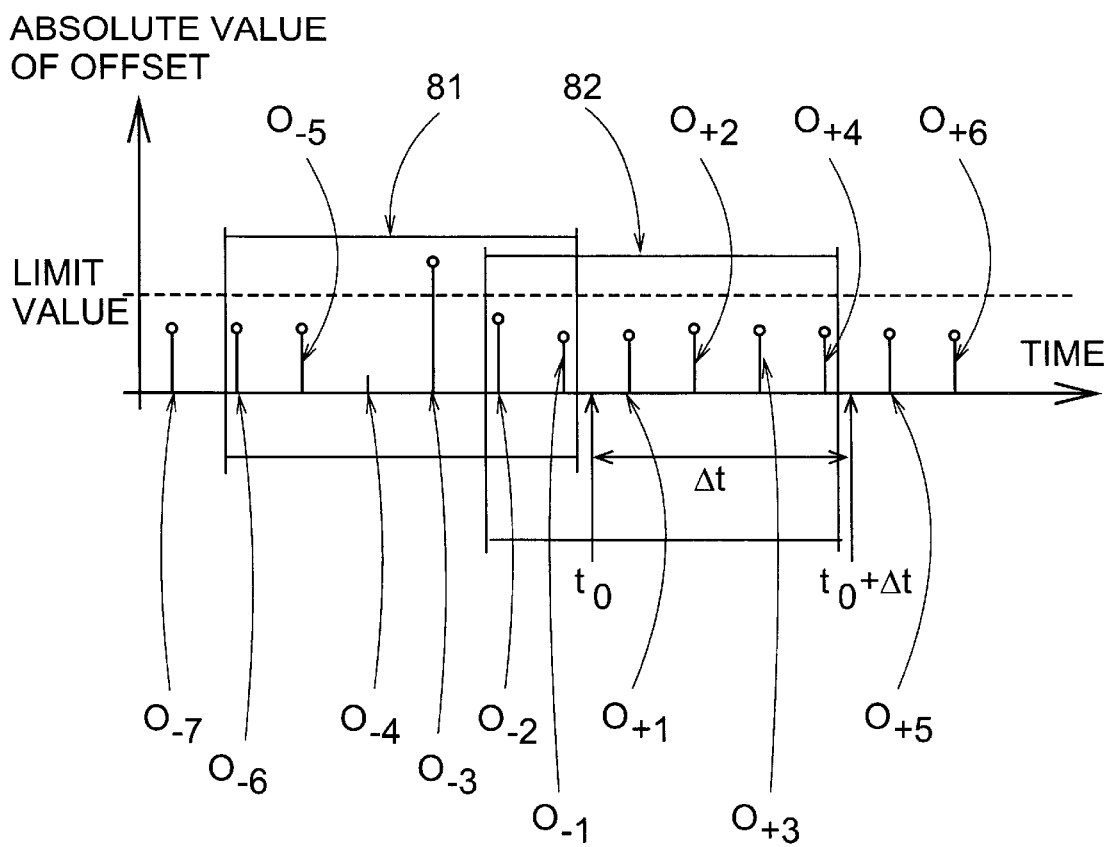
FIG. 8 shows a detail associated with the invention.

FIG. 8 illustrates reliability checking of the start time $t_o$. The offsets (absolute value) used in NTP adjustments preceding the start time $t_0$ are indicated by $O_{-1}$ – $O_{-7}$ and the offsets to be used in NTP adjustments subsequent to the start time $t_0$ by $O_{+1}$ – $O_{+6}$. In the case of FIG. 8, in the start time $t_0$ reliability checking, absolute values ($O_{-6}$ – $O_{-1}$) of the offsets used in six NTP adjustments (window 81) immediately preceding the start time $t_0$ are compared with the limit value set to the offset. In the case of FIG. 8, the start time $t_0$ is not reliable, since, firstly, the offset $O_{-4}$ is missing and, secondly, the absolute value of the offset $O_{-3}$ exceeds the limit value. Thus, it is necessary to delay the start time with a delay $\Delta t$ to time instant $t_0+\Delta t$, when the effect of offsets $O_{-3}$, $O_{-4}$ which led to rejection of the start time $t_0$ has disappeared. If the time interval between the NTP adjustments around the start time is one minute, the delay $\Delta t$ in this case is four minutes. In the reliability checking of a new start time $t_0+\Delta t$, offsets within the window 82 are considered. In the case of FIG. 8, the start time $t_0+\Delta t$ is reliable, because the offsets ($O_{-2}$ – $O_{+4}$) within the window 82 are all lower than the limit value and none of said offsets is missing.

To achieve a sufficient long-term accuracy, the pulse counting time (monitoring period) is several orders longer than the computational maximum error in the NTP adjustment. For instance, the monitoring period can be one hour or several hours.

When the counting time (e.g. 8 hours) expires at time instant $t_1$ from the actual start time of counting, the oscillator control program 53 asks the pulse counter for the final reading of calculated pulses (block 75). However, the pulse counter is allowed to continue pulse counting. In a similar manner as in connection with the start time, the oscillator control program 53 now checks (in block 76) if the end time is reliable. It is checked here whether the time of the system clock 42 at the final reading instant $t_1$ can be considered reliable. This checking is effected, as described above, for instance by comparing the absolute values of the offsets used in six NTP adjustments immediately preceding the end time $t_1$ with the limit value set to the offset. If the absolute values of all six offsets are lower than said limit value and if no offset is missing, nothing indicates disturbance prior to the end time $t_1$ and the end time $t_1$ can be considered reliable. But if one of the offsets exceeds said limit value or if one of the offsets is missing, this indicates disturbance and consequently the end time $t_1$ cannot be considered reliable.

If the end time $t_1$ is reliable, pulse counting can be stopped. The time instant $t_1$ is now considered the end time and block 78 is proceeded to, where the oscillator control program 53 defines a new digital control value (DAC control word) for DAC for adjusting the oscillating frequency.

But if the end time $t_1$ is not reliable, the control program 53 rejects the final reading (block 77). A new final reading is now read (proceed to block 75) after a delay $\Delta t'$ at a time instant $t_1+\Delta t'$ when the effect of the offset that led to rejection of the previous end time $t_o$ has disappeared, whereafter the oscillator control program 53 checks again whether the end time ($t_1+\Delta t'$) is now reliable (block 76). If it is reliable, the time instant $t_1+\Delta t'$ is now considered the end time, oscillator pulse counting is stopped and block 78 is proceeded to for defining a new DAC control word. If the end time is not yet reliable, block 77 is returned to and the final reading is rejected and still a new final reading is read after a delay when the effect of the offset leading to rejection of the previous end time $t_1+\Delta t'$ has disappeared and so on. Iteration continues until a reliable end time is found. The delay $\Delta t'$ preferably equals to the time interval of NTP adjustments made around the end time or a multiple thereof.

In block 78, the control program 53 subtracts from the time instant $t_o$ or $t_1+\Delta t'$, . . . , when the final reading was taken, the time instant $t_o$ or $t_0+\Delta t$, . . . , when pulse counting started. The difference is the measuring time. Since pulse counting started from zero at the start time, the final reading directly indicates the number of oscillating pulses generated by the oscillator 44 between the start time and the end time. The mean oscillating frequency during the pulse monitoring period is obtained by simple calculations. The calculated oscillating frequency of the oscillator is then compared with the nominal frequency of the oscillator. On the basis of the frequency difference, it is possible to determine a new digital control value for the digital-to-analog converter DAC by simple calculations. Having determined the new control value, the control program 53 supplies the new control value during the actual oscillator adjustment period to DAC which converts the control value into control voltage which controls the oscillator 44 to oscillate at the correct nominal frequency. Depending on the implementation, the above-described calculations and the order in which they are performed as well as the implementation of computer software may vary.

An alternative to the preferred embodiment of the invention comprises more than one counter, for instance five counters. Said five counters can all be positioned in a counter circuit 64, for instance. In that case, when the monitoring period begins, the first counter is started at a time instant $t_0$. Other counters are started delayed in such a way, for instance, that the second, third, fourth and fifth counter are started at time instants $t_0+\Delta t$, $t_0+2\Delta t^*$, $t_0+3\Delta t^*$, $t_0+4\Delta t^*$, respectively. The delay $\Delta t^*$ can be, for instance, one minute or several minutes. It can be, but does not necessarily have to be, as long as the interval of NTP adjustments. It is now checked separately for all counters, whether the start time $t_o$, $t_0+\Delta t^*$, ... of each counter is reliable, in a similar manner as above in the description of the preferred embodiment. If a start time is not reliable, said counter is set to zero and restarted after a delay when the effect of the offset leading to rejection of the previous start time has disappeared and so on.

If the start time has to be delayed on several occasions, it is possible to include in counting a lower number of counters than originally planned. Alternatively, if the start time or end time has to be delayed on several occasions, it is possible to raise the limit value set to the offset. To alleviate the load of the NTP server, it is possible to inquire the NTP time from the NTP server less frequently (e.g. at 15 minute intervals) during the counting time than in connection with the start and end times. When a plurality of counters are used, the start and end times can be further graded such that the NTP time inquiries sent to the NTP server take place at different times in order to alleviate the load of the NTP server.

When the counting time (monitoring period) expires, each counter provides a final reading: the first counter at time instant $t_1$, the second counter at time instant $t_1+\Delta t^*$, the third at time instant $t_1+2\Delta t^*$, the fourth at time instant $t_1+3\Delta t^*$ and the fifth at time instant $t_1+4t^*$. However, the counters are allowed to continue counting. Correspondingly, as described in connection with the start time, the oscillator control program checks separately for each counter, whether the end time $t_1, t_1+\Delta t^*, \ldots$ is reliable. If an end time is not reliable, a new final reading is taken again after a given delay and so on. The control program 53 stores in the system memory the final reading of each counter and the time instant when the final reading was taken. Since pulse counting started from zero at the start time, the final reading indicates directly the number of oscillating pulses generated by the oscillator 44 between the start time and the end time. A mean oscillating frequency during the pulse monitoring period is obtained counter-specifically by simple calculations. Five frequency values are thus obtained in total. Of these five frequency values is calculated an average that is compared with the nominal frequency of the oscillator. On the basis of the frequency difference, a new digital control value can be determined by simple calculations for the digital-to-analog converter DAC, which control value when converted into analog control voltage makes the oscillator vibrate at the correct nominal value.

Typically, higher accuracy is achieved in the adjustment using averaging than in the adjustment based on the use of one single counter. However, if the oscillating frequency calculated on the basis of the number of pulses of a counter during the monitoring period deviates considerably from the oscillating frequencies calculated on the basis of the number of pulses of other counters, it can be assumed that said counter has failed in counting. According to the invention, a value that deviates considerably from other oscillating frequency values can be omitted from calculation of an average. If there is considerable deviation in all calculated frequency values, according to the invention, the DAC control value calculated on the basis of these deviating frequency values can be ignored in the adjustment and the oscillator can be adjusted on the basis of the preceding control value or the mean of the preceding control values. The control program 53 stores the DAC control values in the log file in the system memory where previous control values are also found.

Alternatively, the five counters set forth above in the description of the alternative to the preferred embodiment of the invention can also be implemented by one counter. This counter is allowed to count oscillator pulses on a continuous basis. Thus, five counters can be implemented by one counter performing five separate pulse counts. In practice, a current pulse number of the counter is stored in the memory at the start time $t_o$ of the first pulse count to be the initial reading of the first count, at the start time $t_0+\Delta t^*$ of the second count a current pulse number of the counter is stored to be the initial reading of the second count and so on. Correspondingly, at the end time $t_1$ of the first count a current pulse number of the counter is stored to be the final reading of the first count and so on. Reliability checkings of the start and end times are performed in a corresponding manner as above. The pulses counted in each count during the monitoring period (counting time) are obtained by subtracting the initial readings from the final readings of the counts and so on. In this case, five separate counters described in the previous embodiment, were replaced by one counter performing five separate pulse counts.

Figure 9:
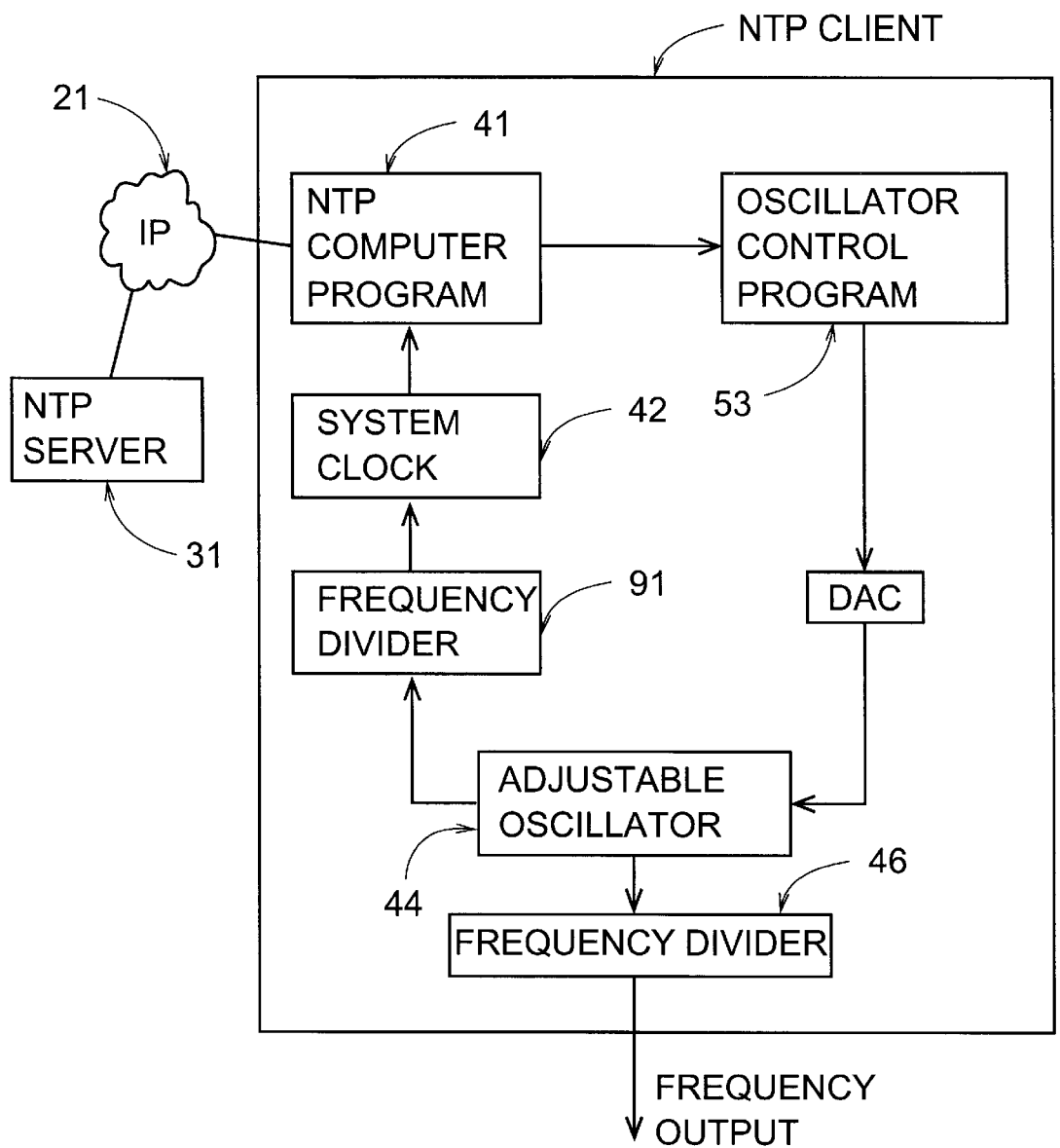
FIG. 9 shows a second embodiment of the invention.

FIG. 9 illustrates a second embodiment of the invention, in which the reference signal of the system clock 42 is taken, instead of the real time clock of the PC, from the adjustable oven stabilized crystal oscillator 44 whose adjustment for improving the long-term stability of the same is the object of the present invention. Prior to applying the oscillation of the oscillator 44 to the system clock, the high-frequency oscillation is divided in a frequency divider 91 into a more suitable frequency for the system clock.

In the adjustment of the oscillator according to the second embodiment of the invention, the NTP computer program 41 of the NTP client regularly inquires the NTP time from the NTP server 31 over the IP network. When the NTP client receives the NTP time, the NTP computer program 41 compares the received NTP time with the time of the system clock 42 and concludes on the basis of the difference between the system clock time and the NTP time (offset) whether the NTP time is reliable or not. Reliability checking is performed, where applicable, in the same manner as described in connection with the preferred embodiment of the invention. In practice, it is convenient to calculate a moving average of a few offsets preceding the offset in question (or a moving average of the absolute values of the offsets) and to compare the offset in question therewith, whereby, if the offset in question deviates considerably from the mean value, the NTP time cannot be considered reliable. Otherwise, (i.e. if the offset does not deviate considerably from the mean value) the NTP time can be considered reliable. If an offset value is exceptionally high or it is missing completely, it will be omitted in calculating the average. If the NTP time received by the NTP client is reliable, the oscillator control program 53 uses the offset value for determining the digital control value, DAC control word, which in turn is supplied to the digital-to-analog converter DAC. On the basis of the DAC control word, DAC generates at its output a control voltage by which the oscillating frequency of the oscillator 44 is adjusted. But if the NTP time received by the NTP client-is not reliable, the oscillator is adjusted on the basis of the preceding DAC control word or the mean of the preceding DAC control words.

In other words, in the adjustment of the oscillator according to the second embodiment of the invention, a reference signal is applied to the system clock 42 from the adjustable oven stabilized crystal oscillator 44 and it is monitored how well the system clock keeps time, i.e. how well the oscillator 44 oscillates at the nominal frequency. Since the reference signal for the system clock is taken from the oscillator 44, the oscillator 44 oscillates as accurately as possible at the nominal frequency when the system clock is as accurately as possible on time. If the oscillator oscillates too fast$_1$ the system clock goes too fast, whereby the offset (=the system clock time–the NTP time) shifts in a positive direction. But if the oscillator oscillates too slowly, the system clock goes too slow, whereby the offset value shifts in a negative direction. Difference between the system clock time and the NTP time is thus examined here. Depending on whether the oscillation is too slow or too fast, the oscillator control program 53 adjusts the oscillator 44 with a DAC output voltage which makes the oscillator oscillate at a frequency which makes the absolute value of the offset between the system clock time and the NTP time approach zero, when the oscillating frequency respectively approaches the nominal frequency of the oscillator.

In the second embodiment of the invention, the oscillator adjustment takes place gradually such that the NTP server is inquired for the NTP time, after reception of which the NTP computer program 41 performs reliability checking on the NTP time. If the NTP time is reliable, the oscillator is adjusted one step (=one bit change in DAC control word) toward the nominal frequency on the basis of the offset value. For instance, if the offset value is positive, the value of the DAC control word is decreased by one, whereby the oscillator 44 control voltage and oscillating frequency reduce. If the NTP time is not reliable, the oscillator is adjusted on the basis of the previous DAC control word. On completing one adjustment cycle, a second adjustment cycle is started by inquiring again the NTP time from the NTP server. If the NTP time is reliable, the oscillator is again adjusted one step toward the nominal frequency. If faster adjustment is required, more than one step at a time can be used. After completing a given number of adjustment cycles, the nominal frequency of the oscillator is achieved and the offset value becomes zero. (In practice, the adjustment will finally zigzag around the nominal value.) Then the adjustment of the oscillator can be stopped and restarted at a later stage. Alternatively, the adjustment can be continued until a non-predetermined time.

In the adjustment according to the second embodiment of the invention, the NTP time is inquired from the NTP server typically less frequently than in the preferred embodiment of the invention (i.e. the adjustment cycle is longer in the second embodiment of the invention). If the difference between the time of the system clock 42 and the NTP time received by the NTP client (the offset) is large when the control begins, a shorter adjustment cycle can be used at the beginning (the NTP time can be inquired at one-minute intervals, for instance). The length of the adjustment cycle can be increased as the absolute value of the offset value decreases, and consequently the length of the adjustment cycle can eventually be several hours, for instance eight hours.

Since oscillator pulses are not counted in the second embodiment of the invention, the counter employed in the preferred embodiment of the invention is not needed at all in the second embodiment.

The invention enables improvement of the long-term stability of the oscillator over the packet switched network. Even though the invention provides means for revealing unreliable NTP times received from the NTP server 31, the monitoring period is scheduled to a point of time when the network traffic is lowest, i.e. typically at night time. According to the invention, for improving the accuracy of the NTP time received by the NTP client, it is also possible, within a short period of time, to send an inquiry to one NTP server a plurality of times or once to a plurality of NTP servers and select the received NTP time having the highest accuracy (the NTP time with least round trip delay). How often the oscillator requires adjustment, depends on the quality of the oscillator used and on the desired accuracy of the oscillator output. Typically, the adjustment according to the first embodiment of the invention is convenient to be performed once a week or more often.

The essential parts of the invention can be implemented by means of software. The computer software concerned, which comprises e.g. an NTP computer program 41 and an oscillator control program 53, can be programmed by C programming language, it can be stored in data means, for instance in a memory. It can be transferred and it can be run in a computer, for instance.

Even though the embodiments of the invention employ the NTP protocol, the invention can alternatively be implemented by using any corresponding procedure for communicating the time over the packet switched network 21. In essence, the invention can also be implemented in connection with the third generation mobile networks.

This description presents the implementation and embodiments of the invention by means of examples. It is obvious to the person skilled in the art that the invention is not restricted to the details of the above-described embodiments but the invention can be implemented in a variety of ways without deviating from the characteristics of the invention. The embodiments are intended to illustrate but not restrict the present invention. Thus the implementations and uses of the invention are only restricted by the attached claims. Consequently, various alternative implementations of the invention defined by the claims, also equivalent implementations, are within the scope of the invention.

What is claimed is:

1. A method for improving the long-term stability of an adjustable oscillator in a system, the system including an adjustable oscillator, a time source knowing a clock time with a specified accuracy, and a packet switched network between the oscillator and said time source, the method comprising:

updating a clock on the basis of the clock time known to said time source over the packet switched network, the clock being on the same side of the packet switched network as the adjustable oscillator; and using said clock in the adjustment of the oscillator for adjusting the oscillator to oscillate at a desired frequency, wherein updating of the clock includes causing a client residing on the same side of the packet network as said adjustable oscillator to inquire of a server, in a client-server manner, the clock time known to said time source, wherein said server resides on the other side of the packet network as said client.

2. A method according to claim 1 comprising:

counting pulses generated by the oscillator during a counting period for producing oscillator control information, which counting period starts at a determined first time instant and ends at a determined second time instant, said time instants being determined on the basis of the clock time of said clock; and adjusting the oscillator to oscillate at the desired frequency using said control information.

3. A method according to claim 2 comprising:

determining the reliability of the clock time of said clock at said time instants, whereby in the case where the clock time at said first time instant is not reliable, starting of the counting period is delayed with a specified first delay, and in a case where the clock time at said second time instant is not reliable, ending of the counting period is delayed with a specified second delay.

4. A method according to claim 2, wherein NTP (Network Timing Protocol) adjustment is used in updating the clock time of said clock and said first and second time instants are scheduled for a point in time immediately upon performing the NTP adjustment of the clock.

5. A method according to claim 2, wherein said clock is located in the NTP client or in connection therewith, and said time source is an NTP server, the method comprising:

causing the NTP client to inquire and receive from the NTP server a clock time having an accuracy of NTP over the packet switched network;

comparing the clock time of said clock in the NTP client with the received clock time having the accuracy of NTP for obtaining an offset value;

adjusting the clock time of said clock according to NTP on the basis of the offset value;

maintaining data on the offset values in the memory of the system; and determining the reliability of the clock time of said clock at any of said time instants by comparing the offset value used at least in one NTP adjustment of the clock preceding said time instant with a specified condition.

6. A method according to claim 5, wherein offset values used in more than one NTP adjustment of the clock preceding said time instant are compared with a specified condition, which specified condition is that all offset values to be compared are lower than a specified limit value set to the offset value and that none of the offset values to be compared is missing.

7. A method according to claim 1, wherein said clock is located in the NTP client or in connection therewith, and said time source is the NTP server, the method comprising:

causing the NTP client to inquire and receive from the NTP server a clock time having an accuracy of NTP over the packet switched network;

comparing, in the NTP client, the clock time of said clockwith the received clock time having the accuracy of NTP for obtaining an offset value;

maintaining data on the offset values in the memory of the system;

determining the reliability of the offset value;

adjusting said oscillator on the basis of said offset value in the case where the offset value is reliable; and applying the oscillating frequency of the oscillator as a reference frequency of said clock for updating the clock.

8. A method according to claim 7, wherein the reliability of the offset value is determined by comparing said offset value with a moving average of the offset values which is calculated from a specified set of offset values preceding said offset value.

9. The method according to claim 1, wherein said client receives from said server said clock time known to said time source, and wherein said received clock time is compared to the time of said clock, and wherein said updating of the clock is performed based on said comparison.

10. An apparatus for improving the long-term stability of an oscillator in a system, the system including an adjustable oscillator, a time source knowing a clock time with a given accuracy and a packet switched network between the oscillator and said time source, the apparatus comprising:

a clock which is on the same side of the packet switched network as the adjustable oscillator;

updating means for updating the clock over the packet switched network on the basis of the clock time known to said time source, said updating means including a client residing on the same side of the packet network as said adjustable oscillator, said client operable for inquiring of a server residing on the other side of the packet network as said client, in a client-server manner, the clock time known to said time source; and adjusting means for adjusting the oscillator to oscillate at a desired frequency by means of said clock.

11. Computer software for improving the long-term stability of the oscillator in a system including an adjustable oscillator, a time source which knows a clock time with a given accuracy and a packet switched network between the oscillator and said time source, the software comprising a program code for:

updating the clock over the packet switched network on the basis of the clock time known to the time source, the clock being on the same side of the packet switched network as the adjustable oscillator wherein, for said updating of the clock, a client residing on the same side of the packet network as said adjustable oscillator inquires of a server, in a client-server manner, the clock time known to said time source, which server resides on the other side of the packet network as said client; and using said clock in the adjustment of the oscillator for adjusting the oscillator to oscillate at a desired frequency.

12. A device for adjusting the long term stability of an oscillator comprising:

a client for receiving a clock time and updating a clock for adjusting the frequency of said oscillator; and a server for accessing a time source with a known accuracy and providing said clock time, wherein said client queries said server for said clock time through a packet switched network and said server provides said clock time through said packet switched network.

13. The device of claim 12, wherein said client controls circuitry for comparing said received clock time with a time of said clock and for updating said clock as a result of said comparison.

14. The device of claim 12, wherein said client controls circuitry for monitoring said oscillator using said clock and for adjusting said oscillator on the basis of said monitoring.

15. The device of claim 12, wherein said time source is a GPS system.

16. The device of claim 12, wherein said time source is a crystal.

17. The device of claim 12, wherein said client is an NTP client and said server is an NTP server.

* * * * *